(12) United States Patent
Wrede et al.

(10) Patent No.: US 8,370,112 B2
(45) Date of Patent: Feb. 5, 2013

(54) EVALUATION CIRCUIT FOR PROCESSING DIGITAL SIGNALS, METHOD, AND SENSOR ASSEMBLY

(75) Inventors: Martin Wrede, Reutlingen (DE); Volker Frey, Wangen (DE)

(73) Assignee: Robert Bosch GmbH, Stuttgart (DE)

(*) Notice: Subject to any disclaimer, the term of this patent is extended or adjusted under 35 U.S.C. 154(b) by 616 days.

(21) Appl. No.: 12/085,412

(22) PCT Filed: Nov. 21, 2006

(86) PCT No.: PCT/EP2006/068701
§ 371 (c)(1),
(2), (4) Date: Aug. 7, 2009

(87) PCT Pub. No.: WO2007/060154
PCT Pub. Date: May 31, 2007

(65) Prior Publication Data
US 2009/0306938 A1    Dec. 10, 2009

(30) Foreign Application Priority Data

Nov. 24, 2005  (DE) .................. 10 2005 055 951

(51) Int. Cl.
*G06F 15/00*    (2006.01)

(52) U.S. Cl. ..................................... 702/190
(58) Field of Classification Search .......... 702/119–121, 702/123, 190, 191, 193, 194; 340/2.1, 2.2, 340/2.23, 2.8
See application file for complete search history.

(56) References Cited

U.S. PATENT DOCUMENTS

| 7,222,041 B2* | 5/2007 | Iorga ........................... 702/120 |
| 7,853,438 B2* | 12/2010 | Caruso et al. ................ 702/190 |

FOREIGN PATENT DOCUMENTS

| DE | 199 55 513 | 5/2001 |
| DE | 101 21 716 | 11/2002 |
| DE | 102 17 575 | 11/2003 |
| JP | 2-128116 | 5/1990 |
| JP | 6-229862 | 8/1994 |
| WO | WO 93/16354 | 8/1993 |

* cited by examiner

*Primary Examiner* — Manuel L Barbee
(74) *Attorney, Agent, or Firm* — Kenyon & Kenyon LLP

(57) ABSTRACT

An evaluation circuit for processing digital signals, the evaluation circuit processing an input data word and outputting an output data word, and a method for processing digital signals in an evaluation circuit, and to a sensor assembly.

11 Claims, 3 Drawing Sheets

EVALUATION CIRCUIT FOR PROCESSING DIGITAL SIGNALS, METHOD, AND SENSOR ASSEMBLY

BACKGROUND INFORMATION

An evaluation circuit is described in German Patent Application No. DE 199 55 513. Evaluation circuits of this type, also known as evaluation IC or ASIC, for processing sensor signals are adapted to the particular application. For example, they have a certain measuring range and a certain resolution, which are adapted to the parameters of the input signal received by the sensor, in particular its maximum level. Therefore, in the case of different input signals occurring in different applications, in general different sensors and evaluation circuits are needed to provide the required particular measuring ranges and resolutions. Furthermore, in certain applications input signal peaks may occur which, in the case of a fixed measuring range, cannot be represented without corresponding losses in resolution. It is furthermore disadvantageous that the dynamic range of the sensor is relatively limited.

SUMMARY OF THE INVENTION

The evaluation circuit according to the present invention has the advantage over the related art that different types of sensors may be used for different applications, in particular with different measuring ranges, sensitivities, and resolutions, with only one type of evaluation circuit without the above-described disadvantages. The evaluation circuit according to the present invention has, for this purpose, a plurality of signal paths, each of which is associated with a set of parameters, the parameters defining the gain, the measuring range, and/or the resolution of the particular signal path, for example. The evaluation circuit according to the present invention thus has a substantially greater dynamic range. The dynamic range accessible in principle is thus advantageously better utilizable by the sensors. In addition, the evaluation circuit according to the present invention may be used in a more flexible manner and the multiplicity of types is reduced. According to the present invention, an input data word is processed by at least one signal path resulting in a processed data word. The input data word may also be processed by a plurality of, and in particular by all, signal paths. The term data word is understood in general as a digital data set; input data word is understood as the data set obtained from an analog signal by digitizing with the aid of an analog-digital converter (sigma-delta converter), known to those skilled in the art.

The number of signal paths and the definition of the parameter sets may be adapted to the particular area of use, i.e., application. The number of signal paths is theoretically as large as desired. In practical use, the number is limited by a required measuring range having the corresponding resolution for each signal path. In known applications, for example, for inertial sensors, media sensors, or pressure sensors, the number of reasonably usable signal paths is typically two to four. The parameter sets are usually assigned to the particular evaluation circuit according to the present invention as early as during manufacturing. It is, however, also conceivable that the evaluation circuit according to the present invention is initially manufactured without assigning parameter sets and the parameter sets are only defined later, according to the particular application, in a one-time initialization process. Those skilled in the art understand that at this time individual, unneeded signal paths may also be shut off. The evaluation circuit according to the present invention is thus manufacturable cost-effectively and the multiplicity of parts is reduced.

In a preferred specific embodiment, the evaluation circuit has a threshold value switch, which selects one of the signal paths as a function of the input data word or filters out one of the processed data words of the signal path as the output data word as a function of the input data word. The input data words may also be assigned to one of the signal paths prior to running through these signal paths, for example, if the defined threshold values are exceeded. Alternatively, the threshold value switch may be situated downstream from the signal paths and there filter data words, processed simultaneously by all signal paths, in an appropriate manner. In the case of this integrated evaluation or selection, the digital signal is processed by the corresponding signal path without external influence. This specific embodiment is therefore applicable in a particularly simple and uncomplicated manner. An output signal may be reconstructed later from the differently processed output data words. For this purpose, codes, for example, information about the signal path, are appended to the processed data words.

In a further, preferred specific embodiment, the evaluation circuit has an interface via which at least one of the signal paths is selectable from the outside for processing the input data word or at least one of the processed data words is selectable for output as an output data word. The desired signal path may be selected by a microcontroller of a control unit, for example, via a so-called serial peripheral interface SPI. The particular signal path is addressed or activatable via a defined SPI instruction. In this specific embodiment the user advantageously has an influence on the selection of the signal paths. When only one signal path is selected, coding of the processed data words is not needed in this case because the particular selected signal path is known. Those skilled in the art understand that multiple processed and coded data words which are obtained from the processing of an input data word by multiple signal paths may also be output as a data word. Therefore, one specific embodiment of the present invention, in which no selection of the processed data words takes place, but rather all processed data words having the appended information are coded via the signal path and jointly form the output data word, is particularly simple. A later selection is always possible, for example, using a microcontroller.

The method according to the present invention has the advantage that sensor data may be used with the help of only one evaluation circuit for different applications having different measuring ranges, sensitivities, and resolutions, and/or that the dynamic range is better utilized by the sensors.

One of the signal paths is preferably assigned to the input data word by a threshold value switch. Alternatively, the output data word is filtered out from the processed data words by the threshold value switch. This integrated selection of the signal paths requires no external control.

In a further, preferred specific embodiment of the method according to the present invention, at least one of the signal paths is selectable from the outside for processing the input data word or at least one of the processed data words is selected for output as an output data word. The selection takes place via an interface of the evaluation circuit, for example, to a microcontroller of a control unit. In a particularly preferred manner, information about the particular signal path which performs the processing is appended to the processed data words at the time of the processing. In particular, the information about the corresponding parameter set, i.e., for example, the gain and/or the measuring range, is appended. In the case of digital data, appending or linking additional information is particularly easy. The output data word is also particularly preferably formed from any desired number of processed data words containing the appended information. The appended information allows the data to be reconstructed at any time. In particular, the output data word may be formed from all processed data words, including the appended information. Such a procedure requires no initial selection and is therefore particularly easy to perform.

For example, at a later point in time, one of the processed data words is especially preferably selected from the output data word for further processing. This is done in particular on the basis of the appended information, for example, for selecting the particular processed data word having the optimum resolution.

Another subject matter of the present invention is a sensor assembly having at least one sensor, having the evaluation circuit according to the present invention, and optionally a converter for converting analog sensor signals into digital sensor signals, the digital sensor signals being evaluable by the evaluation circuit using the method according to the present invention. This makes it advantageously possible to provide a multifunctional sensor for different measuring ranges in one component, with no losses occurring in the resolution or in the measuring range.

DETAILED DESCRIPTION

Figure 1:
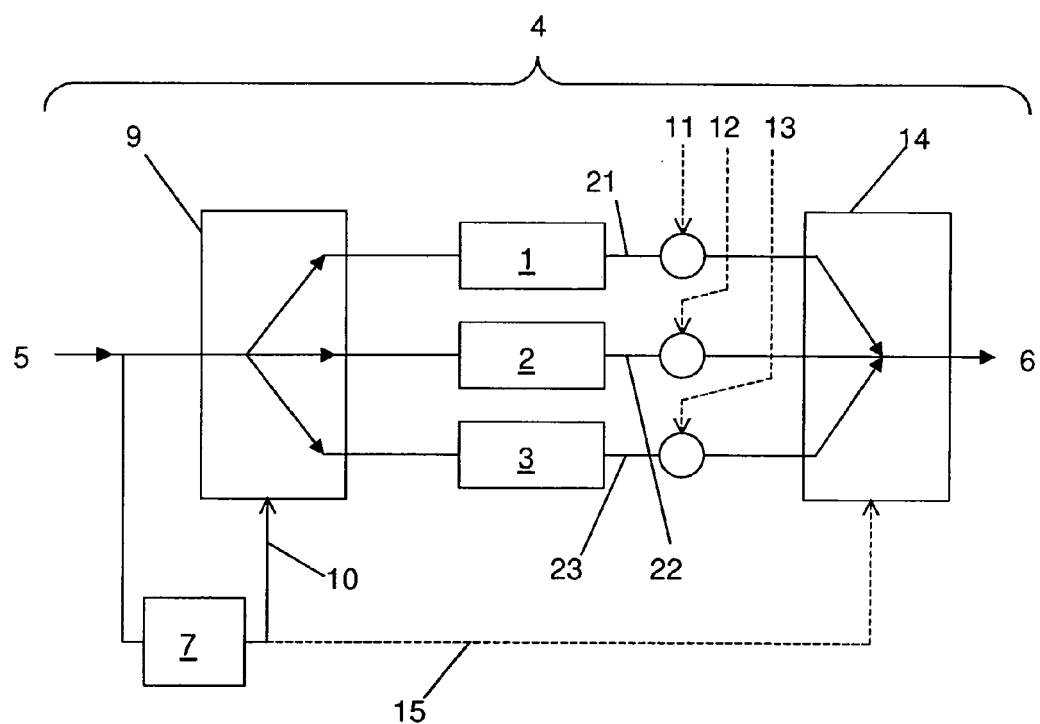
FIG. 1 schematically shows a first specific embodiment of the present invention.

FIG. 1 shows a processing scheme of an evaluation circuit 4 according to the present invention and of a method according to the present invention. A digital input signal 5 is a sequence of input data words 5, which are digitized measuring values of a sensor (not depicted here), for example. Input signal 5 is applied to both a selector 9 and a threshold value switch 7. Threshold value switch 7 compares the measuring value represented by input data word 5 with predefined measuring value ranges each corresponding to a signal path 1, 2, 3 and thus ascertains signal path 1, 2, 3 provided for each input data word 5. A different set of parameters, which determines the type of signal processing, is assigned to each signal path. In the example shown, evaluation circuit 4 has three signal paths 1, 2, 3. Accordingly, three measuring value ranges are provided, so that threshold value switch 7 decides, as a function of the particular input data word 5, to which measuring range and thus to which signal path 1, 2, 3 is current data word 5 to be assigned. However, any other number of measuring value ranges and associated signal paths would also be conceivable. Threshold value switch 7 controls selector 9 via a link which is represented by a line labeled 10. In selector 9, input data word 5 is assigned to one of signal paths 1, 2, 3 for processing.

Data words 21, 22, 23 processed by signal paths 1, 2, 3 as a function of input data words 5 are recombined in a deselector 14 to form a signal 6. In order to be able to evaluate an output data word 6 later, information 11, 12, 13 is required, which is assigned to each processed data word 21, 22, 23 and indicates which of signal paths 1, 2, 3 has output data word 6 run through. This information 11, 12, 13 is appended to the particular processed data word 21, 22, 23 as digital code. This so-called header information may contain the set of parameters, for example, the measuring range, or the gain of the particular signal path 1, 2, 3. It may also contain a back-reference from which the parameters originate.

Those skilled in the art know that the threshold value switch may also control deselector 14 instead of or in addition to selector 9, which is indicated by the dashed line labeled 15. In this case, input data word 5 would be conducted in selector 9 via all signal paths 1, 2, and 3 simultaneously, so that subsequently three processed data words 21, 22, 23 having header information 11, 12, 13 would be applied to deselector 14. The threshold value switch selects, on the basis of the level of input data word 5, one of processed data words 21, 22, 23 having header information 11, 12, 13 as output data word 6.

Figure 2:
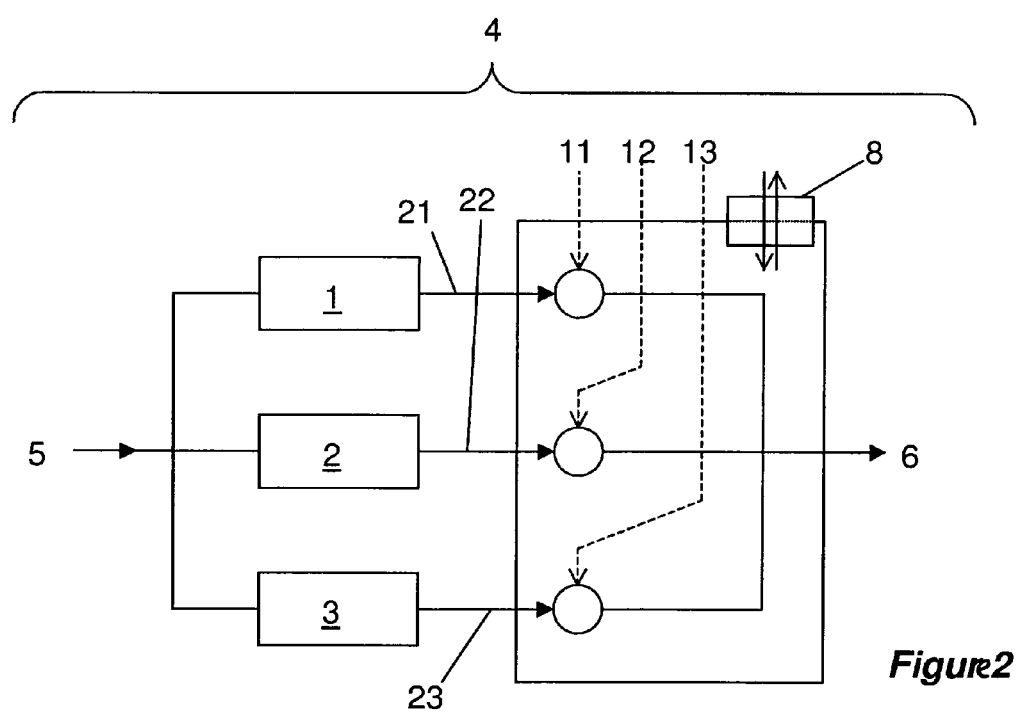
FIG. 2 shows an alternative specific embodiment.

FIG. 2 shows, also schematically, an alternative specific embodiment of evaluation circuit 4 according to the present invention and the method according to the present invention. Input data word 5 is processed simultaneously over each signal path 1, 2, and 3, which results in three processed data words 21, 22, 23 each having appended header information 11, 12, 13, which are available as data word 6.

In another specific embodiment, evaluation circuit 4 has an interface 8, which allows one of the processed data words 21, 22, 23 to be selected, which is then output as output data word 6. It is known to those skilled in the art that in this case no header information 11, 12, 13 is needed because the selected signal path 1, 2, 3 is known to the user who makes the selection from the outside. The selection may be performed, for example, by a microcontroller of a control unit which is not depicted here.

The selection may also be performed upstream from signal paths 1, 2, 3 by the user. In FIG. 1, threshold value switch 7 may be replaced by interface 8, for example. In that case only one of signal paths 1, 2, 3 would be run through. No coding of output data word 6 would be needed.

However, if information 11, 12, 13 is appended to processed data words 21, 22, 23 via the particular signal path 1, 2, 3 that has been run through, then all processed data words 21, 22, 23, together with the respective header information 11, 12, 13, may jointly form output data word 6. No initial selection takes place in this case. The output signal resulting from output data words 6 may be further processed, for example displayed, on the basis of header information 11, 12, 13, at any later point in time, for example, using a microcontroller.

Figure 3A:
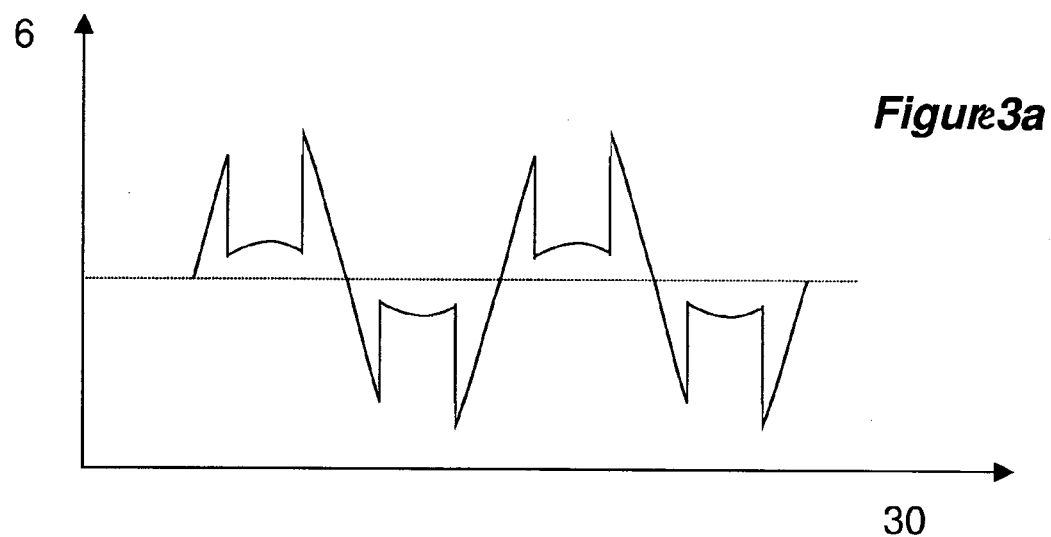
FIGS. 3a and 3b show an exemplary application of the specific embodiment of FIG. 1.
Figure 3B:
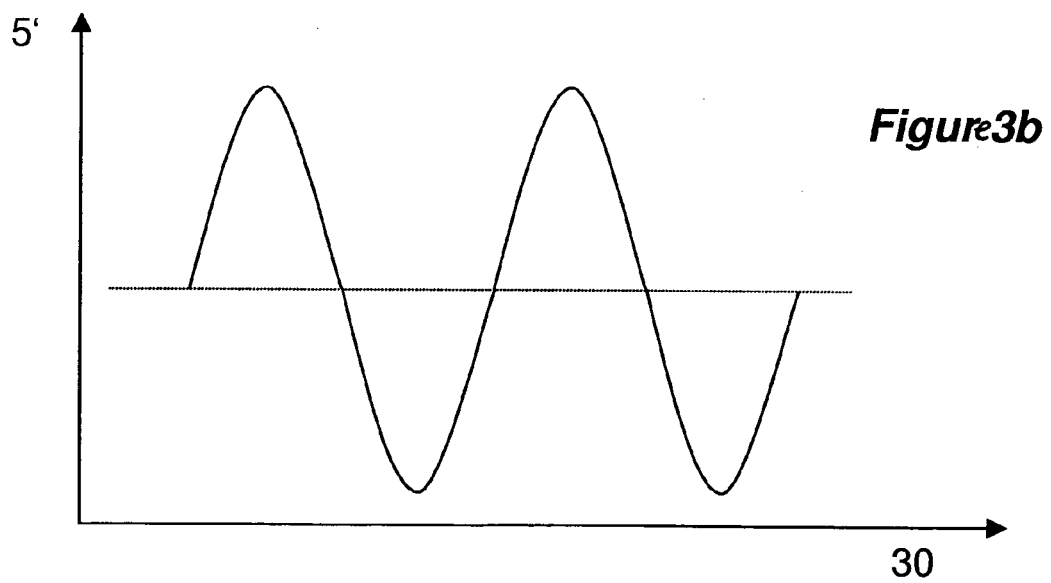

An example of displaying or reconstructing measuring values with the aid of header information 11, 12, 13 is depicted in FIGS. 3a and 3b. Input signal 6 is a sinusoidal signal which is processed in digital form, i.e., in data words 6 by evaluation circuit 4 according to the present invention in the embodiment according to FIG. 1. Threshold value switch 7 assigns input data word 5 to one of signal paths 1, 2, 3. The output signal resulting from output data words 6 is depicted in the diagram of FIG. 3a over time 30. The signal is not constant because when predefined threshold values are exceeded or not reached, switchover to another signal path having another set of parameters occurs. It is to be pointed out that, when a certain absolute value is exceeded, switchover occurs, a greater measuring range and a smaller gain being used for the range of high absolute measuring values; because of this, the output signal has both lower values and a flatter shape. Since each output data word 6 contains the measuring range and the gain as appended information, curve 5' of original input data words 5 may be reconstructed as is apparent from the diagram of FIG. 3b, which depicts the original sinusoidal input signal. A combined sensor assembly may thus be implemented, for example, for measuring accelerations, which detects and processes both slight accelerations at a high resolution and a small measuring range, and high accelerations at a low resolution and a large measuring range.

What is claimed is:

1. An evaluation circuit for processing digital signals, the evaluation circuit processing an input data word and outputting an output data word, comprising:
    an evaluation circuit arrangement for processing digital signals, the evaluation circuit processing an input data word and outputting an output data word, the evaluation circuit including a plurality of signal paths, including a processing arrangement for processing the input data word by at least one of the signal paths, an assigning arrangement for assigning a set of parameters to each of the signal paths, wherein different processing of the input data word is provided by the particular signal path resulting in at least one processed data word as a function of parameters of the particular signal path, wherein information about the particular signal path which performs the processing is appended to the at least one processed data word at a time of processing, and wherein the at least one processed data word is selected from the output data word for further processing, on the basis of the appended information; and
    a threshold value switch which selectively assigns the input data word to one of the signal paths.

2. The evaluation circuit according to claim 1, further comprising a threshold value switch which assigns the input data word to filter the output data word out from the processed data word.

3. The evaluation circuit according to claim 1, further comprising:
    an interface, wherein at least one of the signal paths is selectable from outside via the interface for processing the input data word or the at least one processed data word is selectable for output as an output data word.

4. A method for processing digital signals in an evaluation circuit, the evaluation circuit processing an input data word and outputting an output data word, the evaluation circuit having a plurality of signal paths, the method comprising:
    processing the input data word by at least one of the signal paths;
    assigning a set of parameters to each of the signal paths;
    providing different processing of the input data word by the particular signal path resulting in at least one processed data word as a function of parameters of the particular signal path, and
    appending information about the particular signal path which performs the processing to the at least one processed data word at a time of processing,
    wherein the at least one processed data word is selected from the output data word for further processing, on the basis of the appended information.

5. The method according to claim 4, further comprising:
    filtering out the output data word from the processed data word by the threshold value switch.

6. The method according to claim 4, further comprising:
    performing one of (i) selecting at least one of the signal paths from the outside via an interface of the evaluation circuit for processing the input data word; and (ii) selecting the at least one processed data word for output as an output data word.

7. The method according to claim 4, wherein the output data word is formed from a desired number of processed data words containing the appended information.

8. The method according to claim 4, further comprising:
    assigning, using a threshold value switch, the input data word to filter the output data word out from the processed data word.

9. The method according to claim 4, wherein at least one of the signal paths is selectable from outside via an interface for processing the input data word or the at least one processed data word is selectable for output as an output data word.

10. A sensor assembly, comprising:
    at least one sensor; and
    an evaluation circuit for processing digital signals, the evaluation circuit processing an input data word and outputting an output data word, the evaluation circuit including a plurality of signal paths, including a processing arrangement for processing the input data word by at least one of the signal paths, an assigning arrangement for assigning a set of parameters to each of the signal paths, wherein different processing of the input data word is provided by the particular signal path resulting in at least one processed data word as a function of parameters of the particular signal path, wherein information about the particular signal path which performs the processing is appended to the at least one processed data word at a time of processing, and wherein the at least one processed data word is selected from the output data word for further processing, on the basis of the appended information; and
    a threshold value switch which selectively assigns the input data word to one of the signal paths.

11. The sensor assembly according to claim 10, further comprising:
    a converter for converting analog sensor signals into digital sensor signals, the evaluation circuit evaluating the digital sensor signals.

* * * * *

UNITED STATES PATENT AND TRADEMARK OFFICE
CERTIFICATE OF CORRECTION

PATENT NO.       : 8,370,112 B2  
APPLICATION NO.  : 12/085412  
DATED            : February 5, 2013  
INVENTOR(S)      : Wrede et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1179 days.

Signed and Sealed this

First Day of September, 2015

Michelle K. Lee
*Director of the United States Patent and Trademark Office*